United States Patent
Grambichler

(10) Patent No.: US 9,846,173 B2
(45) Date of Patent: Dec. 19, 2017

(54) SENSOR SIGNAL TRANSMISSION

(71) Applicant: Infineon Technologies AG, Neubiberg (DE)

(72) Inventor: Klaus Grambichler, Velden (AT)

(73) Assignee: Infineon Technologies AG, Neubiberg (DE)

( * ) Notice: Subject to any disclaimer, the term of this patent is extended or adjusted under 35 U.S.C. 154(b) by 395 days.

(21) Appl. No.: 14/604,983

(22) Filed: Jan. 26, 2015

(65) Prior Publication Data

US 2016/0218711 A1    Jul. 28, 2016

(51) Int. Cl.
  *G01P 21/02* (2006.01)
  *G01P 3/44* (2006.01)
  *H03K 5/1536* (2006.01)
  *G01P 3/488* (2006.01)

(52) U.S. Cl.
  CPC ............. *G01P 3/44* (2013.01); *G01P 3/488* (2013.01); *G01P 21/02* (2013.01); *H03K 5/1536* (2013.01)

(58) Field of Classification Search
  CPC ........................................................ G01P 21/02
  See application file for complete search history.

(56) References Cited

U.S. PATENT DOCUMENTS

| | | | | | |
|---|---|---|---|---|---|
| 4,410,948 | A | * | 10/1983 | Doniger | H02P 5/46 701/100 |
| 5,418,453 | A | * | 5/1995 | Wise | G01P 3/488 324/160 |
| 8,594,900 | B2 | * | 11/2013 | Couch | B60C 23/20 701/29.1 |

* cited by examiner

*Primary Examiner* — Robert R Raevis
(74) *Attorney, Agent, or Firm* — Schiff Hardin LLP

(57) ABSTRACT

A speed sensor including an output data signal generator configured to generate an output data signal representing a state of a sensed element; and a multiplexer configured to multiplex the output data signal and an internal diagnostic data signal representing diagnostic data of the speed sensor into a combined data signal.

20 Claims, 4 Drawing Sheets

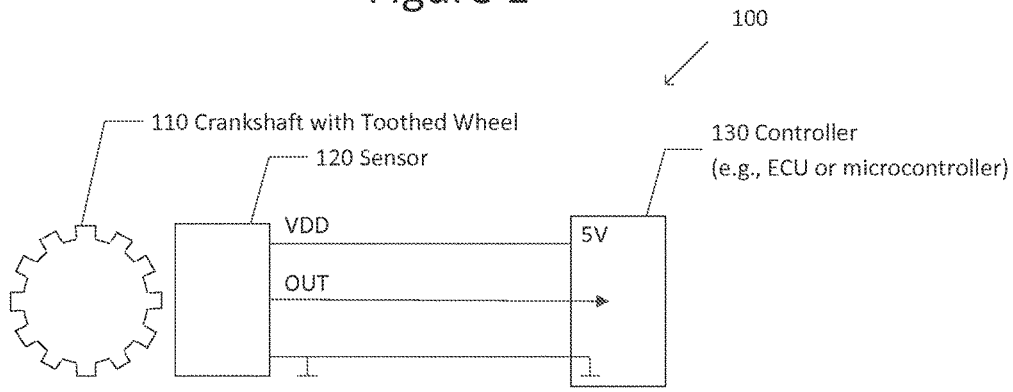
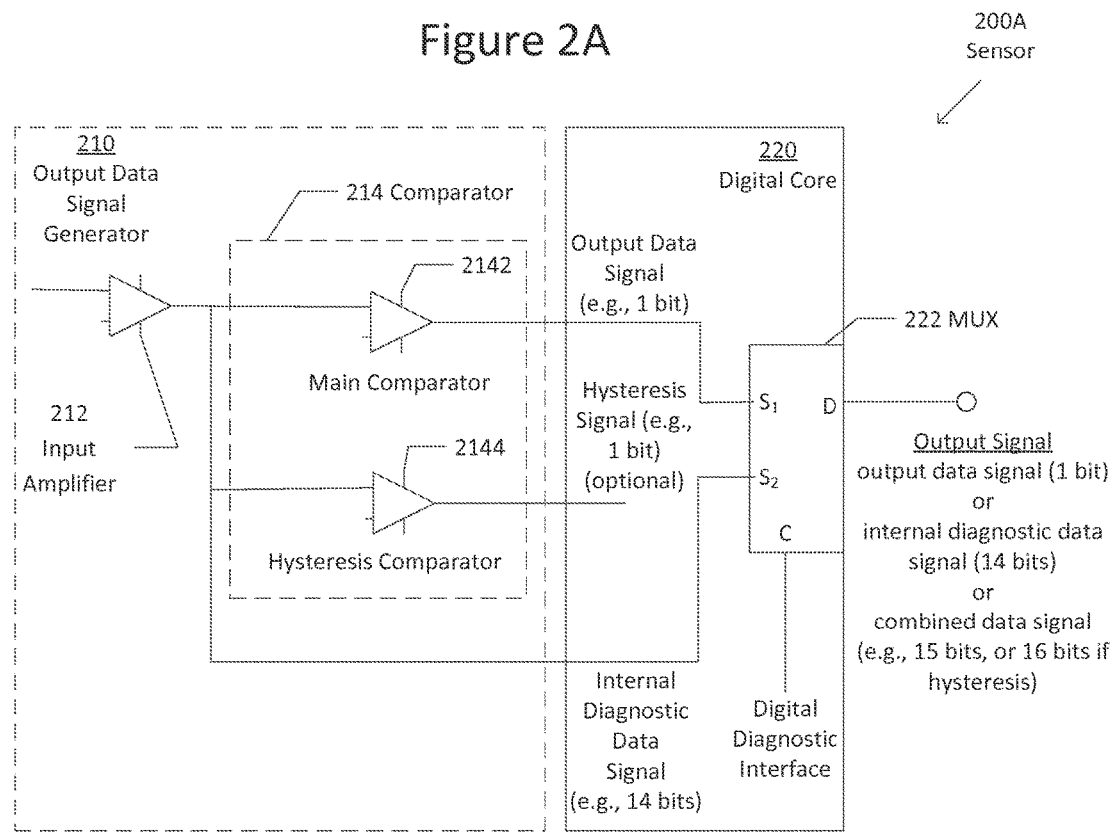

200B
Data Word
(e.g., 16 Bits)

Start Bit | Output Data Signal | Hysteresis (optional) | Internal Diagnostic Data Signal | Stop Bit 200C
Time
Multiplexing

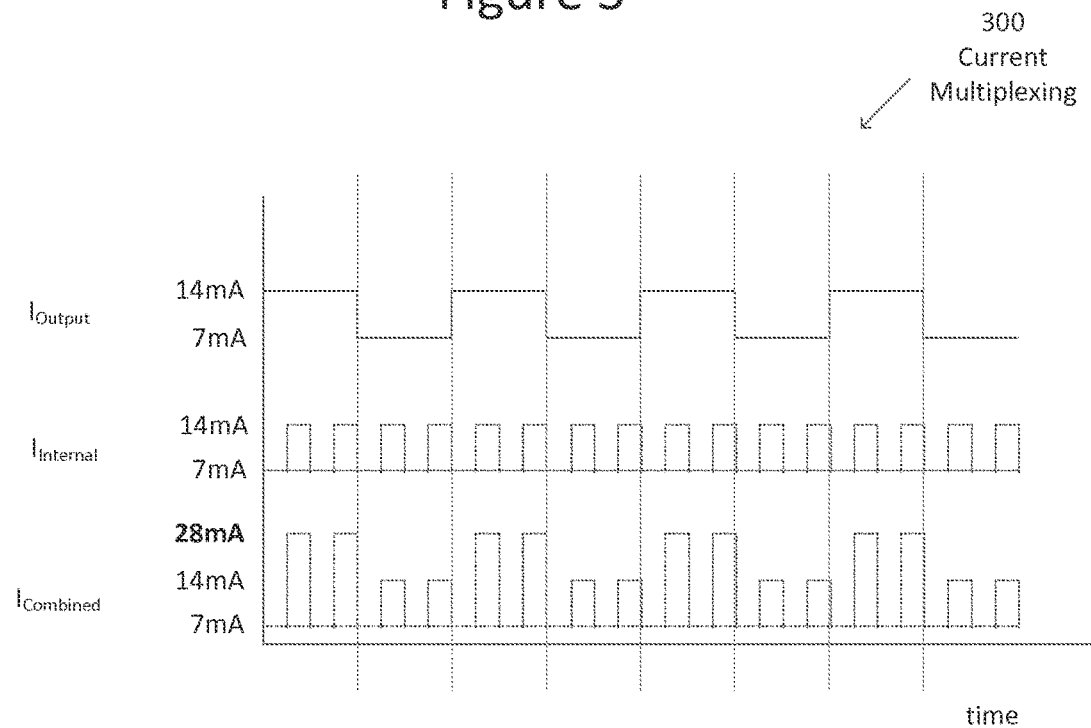
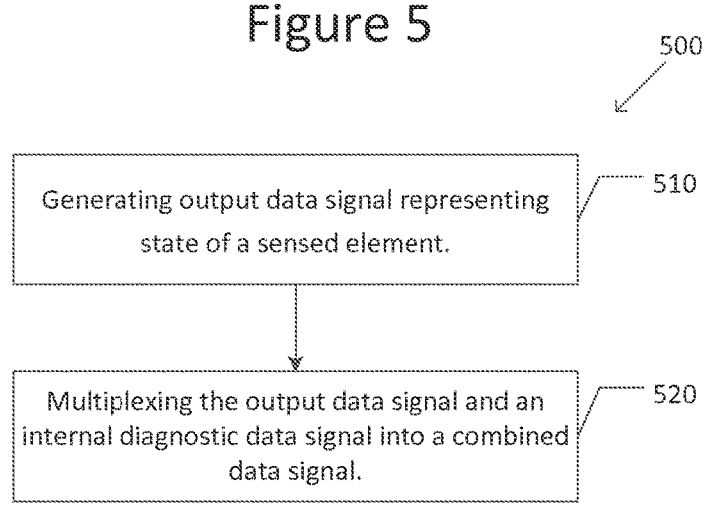

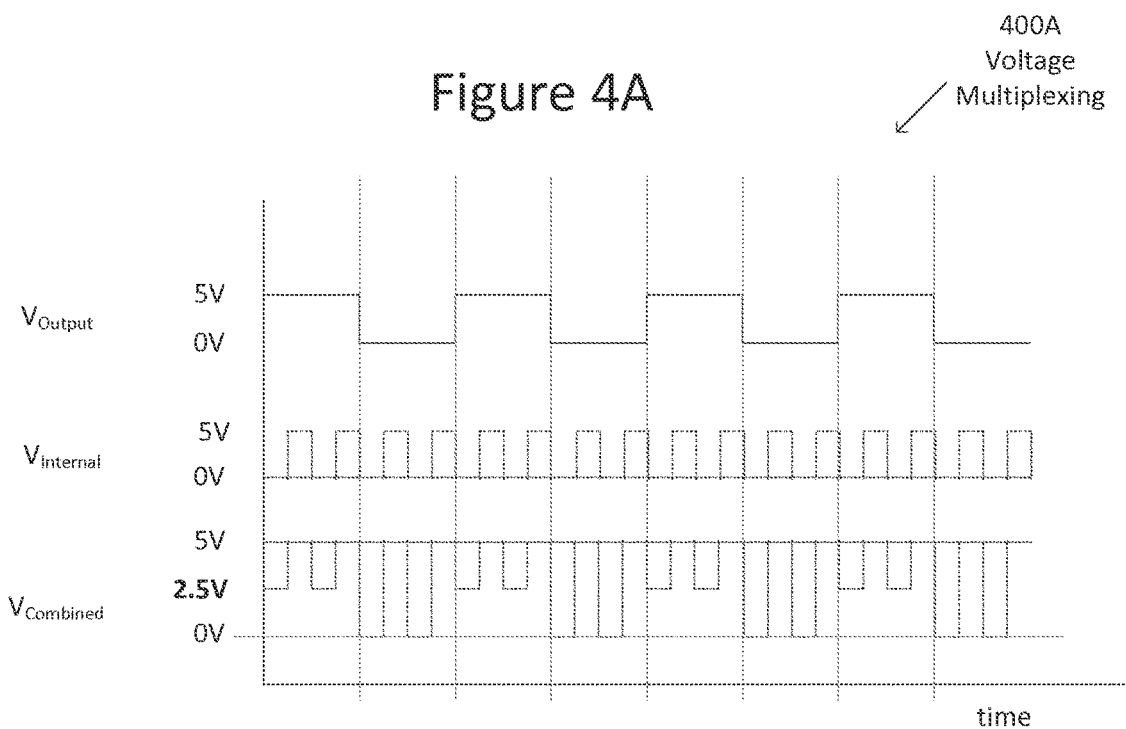
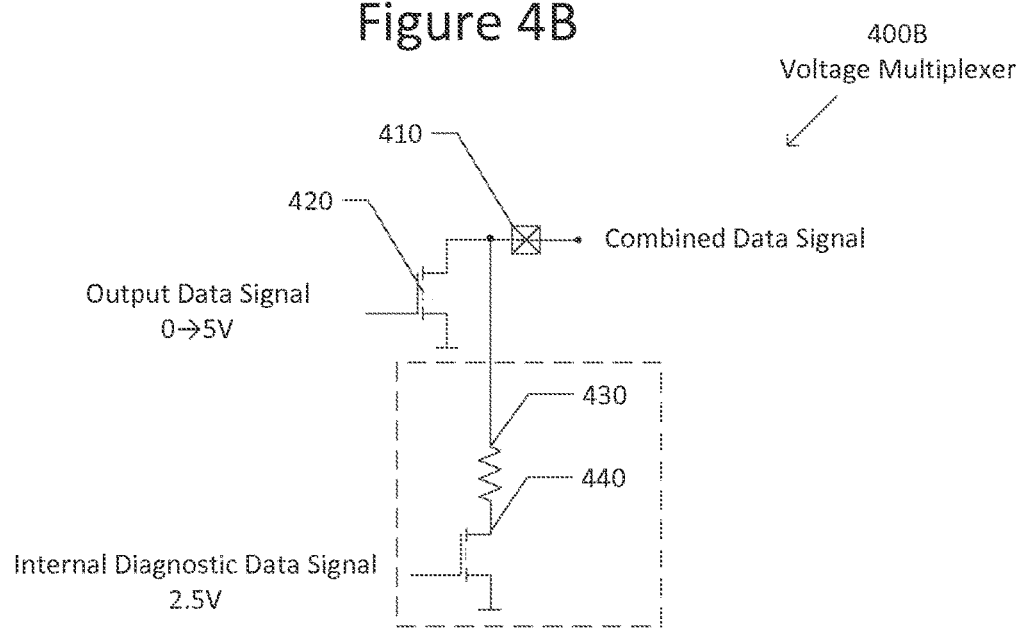

US 9,846,173 B2

SENSOR SIGNAL TRANSMISSION

BACKGROUND

Sensors for automobiles, such as anti-lock brake, gearbox, camshaft, and crankshaft sensors, transmit an output data signal on a single pin. The output data signal, for example, in the case of a crankshaft sensor, uses a single bit to indicate the position and/or rotational speed of the crankshaft. Using a single pin to transmit the output data signal reduces cost, weight, and/or risk of error.

In addition to the output data signal, there is a desire to transmit the raw, multiple bit internal data signal for diagnosis purposes. There is no additional pin available for transmitting this internal data signal. Either the output data signal or the internal diagnostic data signal is transmitted, but not both signals at the same time.

BRIEF DESCRIPTION OF THE DRAWINGS

FIG. 1 illustrates a schematic diagram of a sensor system.
FIG. 2A illustrates a schematic diagram of a sensor.
FIG. 3 illustrates a graph of current multiplexing sensor signals.
FIG. 4A illustrates a graph of voltage multiplexing sensor signals.
FIG. 4B illustrates a circuit diagram of a voltage multiplexer.
FIG. 5 illustrates a flowchart of a method of transmitting sensor signals.

DETAILED DESCRIPTION

Figure 2B:
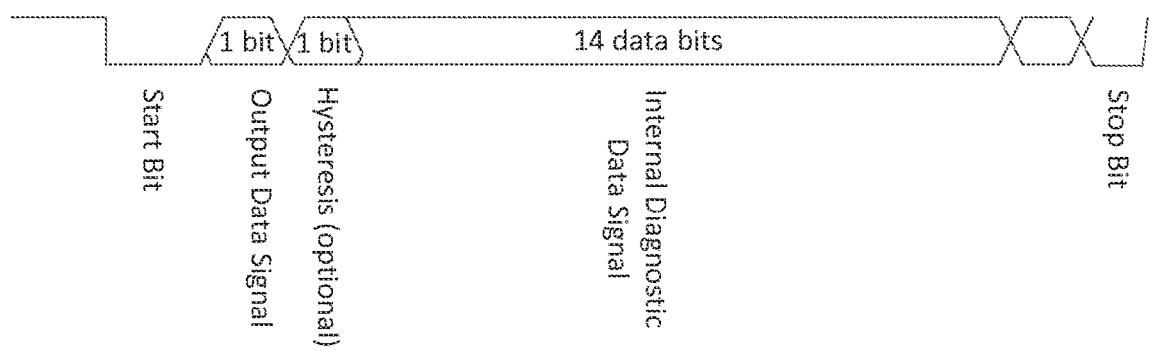
FIG. 2B illustrates a data word of a combined data signal.

The present disclosure is directed to a speed sensor having a multiplexer configured to multiplex an output data signal, which represents a state of a sensed element, and an internal diagnostic data signal, which represents diagnostic data of the speed sensor, into a combined data signal. The output data signal and the internal diagnostic data signal can thus be transmitted simultaneously.

FIG. 1 illustrates a schematic diagram of a sensor system 100.

The sensor system 100 includes a toothed wheel 110, a sensor 120, and a controller 130. The toothed wheel 110, such as that of a crankshaft, has teeth distributed evenly around the circumference. The sensor 120 has three terminals, a voltage supply VDD, an output data signal OUT, and ground. The controller 130 may be a microcontroller or an Electronic Control Unit (ECU), for example.

When the toothed wheel 110 rotates, the teeth and notches pass by the sensor 120 creating a changing magnetic flux density that is converted into a 1-bit output data signal representing the wheel 110's state, such as speed and direction. When a tooth of the wheel 110 passes the sensor 120, the output data signal may be high (e.g., logic level "1"), and when a notch passes, the output data signal may be low (e.g., logic level "0"). Thus, in the normal operation, when a predetermined condition of the sense signal is reached, for example a zero crossing of the sense signal or a zero crossing with a positive slope of the sense signal etc., the sensor may trigger the output of the corresponding logical level. This output data signal is transmitted to the controller 130 to control, for example, ignition and fuel injection timing of a vehicle. In other words, in the normal operation, the output data signal changes from high to low or the reverse whenever a predetermined condition of the sense signal is fulfilled.

In addition to the output data signal, sensor customers also want to receive an internal diagnostic data signal. The output data signal represents the profile of the toothed wheel 110, whereas the internal diagnostic data signal is a raw version of this signal having more detailed sampled information, such as a distance between the sensor 120 and the toothed wheel 110, to provide information about the quality of the toothed wheel. As will be described in more detail below, a word of a combined data signal comprises the output data signal and the internal diagnostic data signal multiplexed and transmitted simultaneously.

FIG. 2A illustrates a schematic diagram of the sensor 200A of FIG. 1.

The sensor 200A, which corresponds to the sensor 120 of FIG. 1, includes an output data signal generator 210 and a digital core 220 with a multiplexer 222.

The output data signal generator 210 is configured to generate an output data signal representing a state of an element, such as the crankshaft with toothed wheel 110, as shown in FIG. 1. The output data signal generator 210 includes an input amplifier 212 and a comparator circuit 214.

The comparator circuit 214 includes a main comparator 2142 and a hysteresis comparator 2144 coupled in parallel. The main comparator 2142 is configured to determine a zero-crossing of a sense signal based on the state of the element and to output a logic "1", for example, at this zero crossing. A zero-crossing is a point when a sign of the sense signal changes, e.g., from positive to negative, represented by a crossing of the axis in the graph of the sense signal. The hysteresis comparator 2144 is configured to compare the sense signal with a magnitude of a hysteresis, which may be for example 25% of a maximum amplitude of the sense signal, and to output a logic "1", for example, when the sense signal is greater than this magnitude. The hysteresis comparator 2144 functions to eliminate effects of noise, which is generally far less than 25%, so that the comparator 214 does not erroneously provide multiple outputs at a zero crossing. The comparator circuit 214 may be configured to output the output data signal as high (logic "1") after a zero crossing followed by the sense signal becoming greater than the magnitude of the hysteresis value, that is, in this example when the outputs of both the main comparator 2142 and the hysteresis comparator 2144 are logic "1". The output data signal is transmitted to the digital core 220. It is to be understood that conditions of the sense signal other than a zero crossing, for example a zero crossing with a positive slope of the sense signal, may be implemented to trigger a change of the logic level.

The multiplexer 222 of the digital core 220 has three inputs and one output. The three inputs comprise $S_1$ for receiving the output data signal, $S_2$ for receiving the internal diagnostic data signal, and C for receiving a digital diagnostic interface signal, which is a control signal from the controller 130 for switching between outputting the data output signal, the internal diagnostic data signal, and the combined output data signal. When the controller 130 instructs the multiplexer 222 to be in a normal mode, the multiplexor 222 passes the output data signal received at input $S_1$ through to the output D. Thus, in the normal mode the output data signal is a 1-bit data signal, and a change from a first level to a second level of this 1-bit data signal is triggered by a condition for the sense signal, for example the occurrence of a zero crossing or other conditions as described above. The timing of the changes from a first level to a second level of the output data signal is therefore synchronized to the sense signal and therefore synchronized to a rotation. In other words, slow rotations will have a longer time period between successive changes from the first level to the second level than fast rotations. By counting the number of changes from the first level to the second level, the controller is then capable to determine a rotational speed.

When the controller 130 instructs the multiplexer 222 to be in an interface mode, the multiplexer 222 multiplexes the output data signal, received at input $S_1$, and the internal diagnostic data signal, received at input $S_2$, into a combined data signal to be output at output D, as described in more detail below. When the sensor is in the interface mode, the timing of edges of the data signal is no longer synchronized to the rotation speed. Instead, a dedicated communication protocol including, for example a data word or data packet transmission, may be used to transfer the combined data signal. Such communication protocols may, for example, include data protocols in which data words or data packets are transmitted from the sensor to the controller based on a request of the controller for data transmission.

Alternatively, instead of the internal diagnostic data signal, the controller 130 may instruct the multiplexor 222 to output at output D other information received through input $S_2$. This other information is not the internal diagnostic data signal, is not combined with the output data signal, and may include, for example, a static signal stored in firmware, such as a small digital core having 3, 5, or 10 registers, for example. This other information may represent a stored last max value of the sense signal, mean values of the maximum or minimum values when the zero crossing shifts due to a homogeneous magnetic field and thus requiring compensation, etc.

The sensor 120 also has an analog-to-digital converter (not shown) configured to convert the combined data signal from analog to digital for transmission to the controller 130. The controller 130 has a demultiplexer (not shown) configured to demultiplex the combined data signal back into two separate signals—the output data signal and the internal diagnostic data signal, and a digital-to-analog converter (not shown) configured to convert these two signals from digital back to analog. The two separate signals can then be used by the controller 130 to determine whether the sensor 200A is functioning properly. The converter and demultiplexer elements are well known and not illustrated in the figures so as to not unnecessarily obscure other aspects of the disclosure.

FIG. 2B illustrates a data word 200B of the combined data signal.

The combined data signal is a multiplex of the output data signal and the internal diagnostic data signal, and is comprised of data words 200B. The data word may be 16 bits, 14 of which may represent the internal diagnostic data, one of which represents the output data, and optionally one of which represents the hysteresis. Alternatively, the data word may comprise 13 internal diagnostic data bits, an output data bit, and two hysteresis bits. The start and stop bits are standard synchronization bits that occur before and after every transmitted word.

The disclosure is not limited to the specific number of bits disclosed herein. There may be any number of bits suitable for the intended purpose as long as there is a multiplexing of the output data signal and the internal diagnostic data signal into the combined data signal.

Figure 2C:
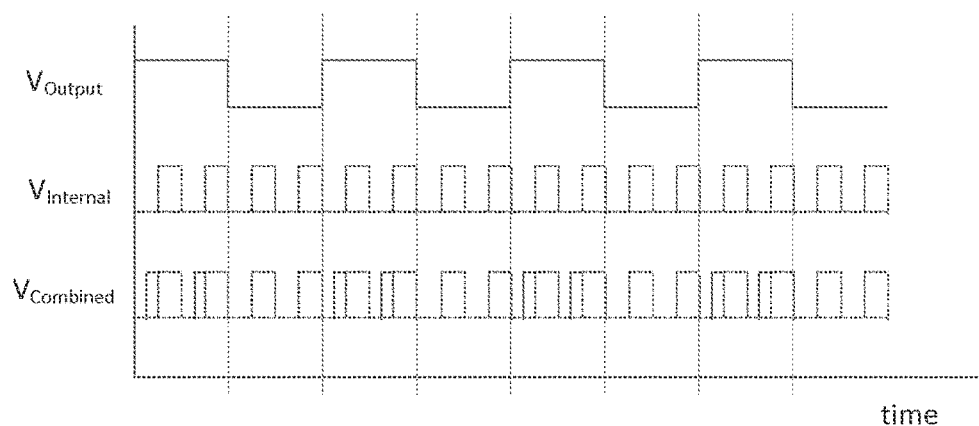
FIG. 2C illustrates a graph of time multiplexing sensor signals.

FIG. 2C illustrates a graph 200C of time multiplexing the output data signal and the internal diagnostic data signal. In other words, the multiplexer 222 may be a time multiplexer.

The graph 200C illustrates three voltage signals versus time, that is, the output data signal $V_{OUT}$, the internal diagnostic data signal $V_{Internal}$, and the combined data signal $V_{Combined}$. As discussed above, the output data signal $V_{Output}$ is a 1-bit signal representing the profile of the toothed wheel 110. In the normal operation mode, $V_{Output}$ corresponds to the output data signal in which the changes from a first level to a second level are synchronized with the rotation of the wheel. The internal diagnostic data signal $V_{Internal}$ may be a 14-bit signal representing more detailed internal diagnostic information. The combined data signal $V_{Combined}$, which in this example is illustrated with 16 transmissions of 16-bit data, represents a combination of the 1-bit output data signal $V_{Output}$ the 14-bit internal diagnostic data signal $V_{Internal}$, and optionally the 1-bit hysteresis signal, and effectively results in simultaneous transmission of samples of the output data signal $V_{Output}$ and the internal diagnostic data signal $V_{Internal}$. In other words, when in the interface mode the sensor is preparing the output of the combined data signal, the level of the output data signal $V_{Output}$ is sampled and then added to the combined data signal $V_{Combined}$ as a 1-bit signal representing the level of the output data signal $V_{Output}$ at the time of sampling. When the combined data signal $V_{Combined}$ is wider, that is, is longer in time as indicated in the figure by the solid line portion of the signal, the controller 130 recognizes that the output data signal $V_{Output}$ is high, and when the combined data signal $V_{Combined}$ is more narrow, that is, is shorter in time, the controller 130 recognizes that the output data signal $V_{Output}$ is low. This combined signal allows a customer to obtain a better understanding of the sensor's internal functioning since the customer is now capable of reconstructing the output data signal $V_{Output}$, which is the signal that would be output as output data signal in the normal mode in addition to receiving the diagnosis data. In some embodiments, the diagnosis data may include data representing samples of the raw sensor signal, i.e., a multi-bit digital representation of samples of the analog raw sensor signal. The raw sensor signal may be the analog signal prior to any further processing, for example, a signal from a Hall element or a signal from a magnetoresistive bridge etc. In such embodiments, since the customer now has samples of the raw signal and samples of the output data signal $V_{Output}$ that would be output by the sensor in the normal mode after processing the raw sensor signal, the customer can gain a better understanding for example when inspecting a faulty behavior of the sensor.

FIG. 3 illustrates a graph 300 of current multiplexing the output data signal and the internal diagnostic data signal.

The multiplexer 222, instead of being a time multiplexer as discussed above with respect to FIGS. 2A-2C, may alternatively be a current multiplexer. In such a case, the output data signal $I_{OUT}$ may be represented with first and second current levels, the internal diagnostic data signal $I_{Internal}$ may be represented with the first and second current levels, and the combined data signal $I_{Combined}$ may be represented with the first and second current levels and additionally a third current level. For example, in addition to 7 mA and 14 mA current levels for each of the output data signal $I_{OUT}$ and the internal diagnostic data signal $I_{Internal}$, it is possible to have 28 mA as a third current level for the combined data signal $I_{Combined}$. When the combined data signal $I_{Combined}$ is 28 mA, the controller 130 recognizes that the output data signal $I_{OUT}$ is high, and when the combined data signal $I_{Combined}$ is 14 mA, the controller 130 recognizes that the output data signal $I_{Output}$ is low.

With a current multiplexer it is still possible to transmit simultaneously the output data signal $I_{OUT}$ and the internal diagnostic data signal $I_{Internal}$ as the combined data signal $I_{Combined}$. In this case the controller 130 requires an additional comparator to distinguish the third current level.

The current multiplexer is described as having three, specific current levels. It is understood that the disclosure is not limited to the number of current levels being three, or the specific current levels described. There may be any number of current levels of any values suitable for the intended purpose.

FIG. 4A illustrates a graph 400A of voltage multiplexing the output data signal and the internal diagnostic data signal.

The multiplexer 222, instead of being a time or current multiplexer as discussed above with respect to FIGS. 2A-2C and 3, respectively, may alternatively be a voltage multiplexer. In such a case, the output data signal $V_{Output}$ may be represented with first and second voltage levels, and the internal diagnostic data signal $V_{Internal}$ may be represented with the first and second voltage levels, and the combined data signal $V_{Combined}$ may be based on the first and second voltage levels and additionally a third voltage level. For example, in addition to 0 V and 5V voltage levels for each of the data output signal $V_{Output}$ and the internal diagnostic data signal $V_{Internal}$, it is possible to use 2.5 V as a third voltage level for the combined data signal $V_{Combined}$. When the combined data signal $V_{Combined}$ is 2.5V, the controller 130 recognizes that the output data signal $V_{Output}$ is high, and when the combined data signal $V_{Combined}$ is 5V, the controller 130 recognizes that the output data signal $V_{Output}$ is low. The combined data signal $V_{Combined}$ goes negative because it is inverted logic.

With a voltage multiplexer it is still possible to transmit simultaneously the output data signal $V_{Output}$ and the internal diagnostic data signal $V_{Internal}$ as the combined data signal $V_{Combined}$. In this case the controller 130 requires additional hardware to distinguish the third voltage level.

The voltage multiplexer is described as having three, specific voltage levels. It is understood that the disclosure is not limited to the number of voltage levels being three, or the specific voltage levels described. There may be any number of voltage levels of any values suitable for the intended purpose.

FIG. 4B illustrates a circuit diagram of a voltage multiplexer 400B.

The multiplexer includes a first open drain transistor 420, a second open drain transistor 440 and a resistor 430 to form a voltage divider. The first open drain transistor 420 has a gate configured to receive the output data signal $V_{Output}$, and a source configured to output the combined data signal $V_{Combined}$. The second open drain transistor 440 has a gate configured to receive the internal diagnostic data signal $V_{Internal}$. The resistor 430 is a pull-down resistor coupled between sources of the first and second open drain transistors 420, 440.

When both gates of transistors 420, 442 are open, the combined data signal is at 5V, when only gate of transistor 420 is open, the combined data signal is at 0V, and when only gate of the lower transistor 442 is open, the combined data signal is half the voltage supply, or 2.5 V.

The dotted box represents the portion of the multiplexer added to handle the third voltage level. The circuitry outside of this box is known and the circuitry that is used for the current multiplexer of FIG. 3. Also, the first and second open drain transistors 420, 440 are shown as field effect transistors, though the disclosure is not limited in this respect.

FIG. 5 illustrates a flowchart 500 of a method of sensing a state of an element, such as a toothed wheel 110.

At Step 510, the output data signal generator 210 generates the output data signal representing the state of the element.

Then, at Step 520, the multiplexer 222 multiplexes the output data signal and the internal diagnostic data signal into the combined data signal.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

What is claimed is:

1. A speed sensor, comprising:
   an output data signal generator configured to generate an output data signal representing a state of a sensed element; and
   a multiplexer configured to multiplex the output data signal and an internal diagnostic data signal representing diagnostic data of the speed sensor into a combined data signal.

2. The speed sensor of claim 1, wherein the output data signal comprises a word at least one bit, and the internal diagnostic data signal is comprised of X number of bits.

3. The speed sensor of claim 2, wherein X equals 14.

4. The speed sensor of claim 2, wherein at least one bit of the word represents a hysteresis.

5. The speed sensor of claim 1, wherein the speed sensor is a magnetic rotation detector.

6. The speed sensor of claim 1, wherein the multiplexer is a time multiplexer.

7. The speed sensor of claim 1, wherein the multiplexer is a current multiplexer.

8. The speed sensor of claim 7, wherein each of the output data signal and the internal diagnostic data signal is represented by first and second current levels, and the combined data signal is represented by the first and second current levels and a third current level.

9. The speed sensor of claim 1, wherein the multiplexer is a voltage multiplexer.

10. The speed sensor of claim 9, wherein each of the output data signal and the internal diagnostic data signal is represented by first and second voltage levels, and the combined data signal is represented by the first and second voltage levels and a third voltage level.

11. The speed sensor of claim 10, wherein the multiplexer comprises:
    a first open drain transistor having a gate configured to receive the output data signal, and a source configured to output the combined data signal;
    a second open drain transistor having a gate configured to receive the internal diagnostic data signal; and
    a pull-down resistor coupled between sources of the first and second open drain transistors.

12. The speed sensor of claim 11, wherein the first and second open drain transistors are field effect transistors.

13. The speed sensor of claim 1, wherein the output data signal Generator comprises a comparator circuit comprising:

a main comparator configured to determine a zero-crossing of a sense signal based on the state of the element; and
a hysteresis comparator configured to compare the sense signal with a magnitude of a hysteresis,
wherein the comparator circuit is configured to output the output data signal as high when the sense signal following a zero-crossing is higher than the magnitude of the hysteresis, and to output the output data signal as low when the sense signal is lower than the magnitude of the hysteresis.

14. A speed sensor system, comprising:
the speed sensor as claimed in claim 1; and
a microcontroller comprising a demultiplexer configured to demultiplex the combined data signal into the output data signal and the internal diagnostic data signal.

15. The speed sensor system of claim 14,
wherein the speed sensor further comprises an analog-to-digital converter configured to convert the combined data signal from analog to digital, and
wherein the microcontroller further comprises a digital-to-analog converter configured to convert the combined data signal from digital to analog.

16. A method of sensing a state of an element, comprising:
generating, by an output data signal generator of a speed sensor, an output data signal representing the state of the element; and
multiplexing, by a multiplexer, the output data signal and an internal diagnostic data signal representing diagnostic data of the speed sensor into a combined data signal.

17. The method of claim 16, wherein the multiplexing is time multiplexing.

18. The method of claim 16, wherein the multiplexing is current multiplexing.

19. The method of claim 16, wherein the multiplexing is voltage multiplexing.

20. A speed sensor, comprising:
an output data signal generating means for generating an output data signal representing a state of a sensed element; and
a multiplexing means for multiplexing the output data signal and an internal diagnostic data signal representing diagnostic data of the speed sensor into a combined data signal.

* * * * *